United States Patent [19]

Medecki

[11] Patent Number: 5,835,217
[45] Date of Patent: Nov. 10, 1998

[54] PHASE-SHIFTING POINT DIFFRACTION INTERFEROMETER

[75] Inventor: Hector Medecki, Berkeley, Calif.

[73] Assignee: The Regents of the University of California, Oakland, Calif.

[21] Appl. No.: 808,081

[22] Filed: Feb. 28, 1997

[51] Int. Cl.[6] .................................................... G01B 9/02
[52] U.S. Cl. .......................... 356/353; 356/354; 356/359
[58] Field of Search ..................................... 356/354, 353, 356/355, 359; 250/237 G

[56] References Cited

FOREIGN PATENT DOCUMENTS 0064139  4/1982  Japan ...................................... 356/354

OTHER PUBLICATIONS

Kwon, Osak Y., "Multichannel Phase–shifted Interferometer," Reprinted with . . . permission from Optics Letters, vol. 9 (2), pp. 59–61,Feb. 1984, Palo Alto, California.
Mercer, Carolyn R. & Creath, Katherine, "Liquid–crystal Point–diffraction Interferometer," Optic Letters, vol. 19, No. 12, Jun. 15, 1994.
Medecki, H., et al., "A Phase–Shifting Point Diffraction Interferometer," Optics Letters, Oct. 1, 1996.
W. P. Linnik, Proceedings of the Academy of Sciences of the U.S.S.R. 1, 208 (1933).
R.N. Smartt, W.H. Steel, Japan. J. of Appl. Phys. 14, (Suppl. 14–1), 351 (1975).
K. A. Goldberg, R. Beguiristain, J. Bokor, H. Medecki, D. T. Attwood, K. Jackson, E. Tejnil, G. E. Sommargren, J. Vac. Sci. Tech. B 13, 2923 (1995).

Primary Examiner—Samuel A. Turner
Attorney, Agent, or Firm—Beyer & Weaver LLP

[57] ABSTRACT

Disclosed is a point diffraction interferometer for evaluating the quality of a test optic. In operation, the point diffraction interferometer includes a source of radiation, the test optic, a beam divider, a reference wave pinhole located at an image plane downstream from the test optic, and a detector for detecting an interference pattern produced between a reference wave emitted by the pinhole and a test wave emitted from the test optic. The beam divider produces separate reference and test beams which focus at different laterally separated positions on the image plane. The reference wave pinhole is placed at a region of high intensity (e.g., the focal point) for the reference beam. This allows reference wave to be produced at a relatively high intensity. Also, the beam divider may include elements for phase shifting one or both of the reference and test beams.

21 Claims, 8 Drawing Sheets

Principle of the Point Diffraction Interferometer

Principle of the Phase Shifting Point Diffraction Interferometer

Phase shifting Point Diffraction Interferometer with diffraction grating.

Phase shifting Point Diffraction Interferometer with double mirror.

Phase Shifting Point Diffraction Interferometer with single mirror.

Phase Shifting Point Diffraction Interferometer with correction of grating aberrations.

PHASE-SHIFTING POINT DIFFRACTION INTERFEROMETER

This invention was made, in part, with U.S. and government support and the contract number DE-AC03-76SF00098, awarded by the Department of Energy. The government has certain rights in this invention.

BACKGROUND OF THE INVENTION

This invention generally relates to interferometers for optical metrology. More specifically, the invention relates to point diffraction interferometers having provisions for phase shifting reference and test beams with respect to one another.

Optical metrology is the study of optical measurements. An area of optical metrology relevant to the present invention is the use of interferometer to measure the quality of a test optic such as a mirror or lens.

One important and relatively recent application of optical metrology is the testing of projection optics for photolithography systems. Modern photolithography systems used to fabricate integrated circuits must continually image smaller features. To do so, systems are confronted with the diffraction limit of the light employed to image a pattern provided in a reticle. To meet this challenge, photolithographic systems must employ successively shorter wavelengths. Over the history of integrated circuit fabrication technology, photolithography systems have moved from visible to ultraviolet and eventually to x-ray radiation.

While shorter wavelengths are employed, photolithography systems nevertheless employ reticles with feature sizes near the resolution limit of the light (currently on the order 0.1 micron). It is quite difficult and expensive to manufacture reticles having such small feature sizes. Further, radiation passing through the reticle's narrow slits and apertures diverges strongly. Thus, reticles must be placed very close to the wafer—sometimes as close as a few microns—so that a sharp reticle image forms on the wafer. Thus, the system must be carefully designed such that the reticle never contacts the wafer, an event that could destroy it.

Because of the increasing difficulties posed by directly imaging a reticle pattern onto a wafer, it is desirable to use projection optics in lithography systems. Such systems include lenses or other optical elements which demagnify reticle images and project them onto the wafer surface. This allows reticles to retain larger feature sizes, thus reducing the expense of generating the reticle itself.

Of course, the projection optics must not introduce substantial distortion in the image projected on the wafer. As with all optic elements, various aberrations such as spherical aberrations, astigmatisms, and coma may be present. These aberrations must be identified during fabrication and/or testing of the projection optics.

For this purpose, interferometers may be employed. Conventional interferometers, based upon the Michelson design for example, employ a single coherent light source (at an object plane) which is split into a test wave and a reference wave. The test wave passes through the optic under test and the reference wave avoids that optic. The test and reference waves are recombined to generate an interference pattern or interferogram. Analysis of the interferogram, with for example Zernike polynomials, indicates the presence of aberrations.

The reference wave of an interferometer should be "perfect"; that is, it should be simple and well characterized, such as a plane or spherical wave. Unfortunately, beam splitters and other optics through which the reference beam passes introduce some deviations from perfection. Thus, the interferogram never solely represents the condition of the test optic. It always includes some artifacts from the optical system through the reference wave passes. While these artifacts can in theory be separated from the interferogram, it is usually impossible to know that a subtraction produces a truly clean interferogram.

To address this problem, an interferometer of relatively simple design, the "point diffraction interferometer", has been developed. These devices generate reference waves through a point (a pinhole) in the path the test beam. The light passing through the pinhole, unencumbered by beam splitters, mirrors, lens, or other optical elements, closely approximates the ideal spherical wave desired for a reference wave.

A point diffraction interferometer 10 is depicted in FIG. 1. The interferometer employs electromagnetic radiation 2 from a source which may be coherent (e.g., a laser) or incoherent (e.g., a mercury vapor lamp). To provide spatially coherent radiation 8 for the test and reference waves, radiation 2 passes through a pinhole 4 in an object plane 6. Spatially coherent radiation 8 then impinges on an optic under test 12 (e.g., a lens for a photolithography projection system) which modifies the radiation path and projects a test beam (characteristic of the optic under test) onto a semitransparent membrane 14 in an image plane 16. The image the source projected onto the image plane is an Airy pattern affected by aberrations of the optic. The radiation passing through semitransparent membrane 14 forms a test wave 18 which illuminates a screen 20 which may be a photographic plate or an array of charge coupled devices ("CCDs"), for example.

Membrane 14 includes a pinhole 22 which passes a small portion of the test beam radiation from optic 12. The pinhole has diameter near the diffraction limit of the radiation such that it produces a "perfect" spherical reference wave 24, which also illuminates screen 20. The pattern of constructively and destructively interfering regions of waves 18 and 24 produces an interference pattern 26 on screen 20.

It is important to realize that a point diffraction interferometer such as illustrated in FIG. 1 provides a "perfect" spherical reference beam without use of "perfect" optical components in interferometer. It also provides a common path for both the reference and test waves, allowing for the use of a source having low temporal coherence.

In designing a point diffraction interferometer, the separation distance of the reference beam pinhole from the center of the Airy pattern should be relatively large. This ensures that the interference fringes will be relatively straight, parallel, and equidistant. Any deviations from these characteristics are due to the aberrations which can be determined from analysis of the interference pattern. Thus, the interference pattern is relatively easy to interpret.

One rather serious downside of the point diffraction interferometer depicted in FIG. 1 is that it produces a reference beam of quite low intensity. In order to achieve interference fringes of good visibility, both the aberrated and reference wave should have similar intensities. This is achieved by reducing the intensity of the test wave to match the intensity of the reference wave—which has been reduced by both the small pin hole size and its location away from the Airy pattern center. This reduction of intensity is approximately three to four orders of magnitude and is compensated by reducing the transmission of the aberrated wave through the semitransparent membrane.

To increase the reference wave intensity, the pinhole could, in theory, be placed in the center of the semitransparent membrane, the resulting interference fringes would be concentric circles. Such interference patterns are rather difficult to analyze as the separation between fringes varies quadratically. Thus, it can be very difficult to measure enough fringe data to sufficiently describe the quality of the test optic.

Another drawback of the point diffraction interferometer is that the semitransparent membrane with its small pinhole is very fragile and of difficult construction. For example, the membrane may be made from a 0.1 $\mu$m thick sheet of silicon nitride.

Yet another difficulty with the point diffraction interferometer shown in FIG. 1 is that phase shifting between the reference and test waves is not easily accomplished. Unfortunately, phase shifting is often necessary to improve the accuracy of the instrument. One approach to phase shifting in point diffraction interferometers is described in Kwon, Osak Y., "Multichannel Phase-shifted Interferometer," Optics Letters, Vol. 9 (2), pp. 59–61, February 1984. This article describes placing a transmission grating in contact with the pinhole on the membrane and translating the grating with respect to the pinhole. Unfortunately, this is relatively difficult to implement as the transmission grating will interfere with the function of fragile semitransparent membrane 14.

Another approach to phase shifting in point diffraction interferometers is presented in Mercer, Carolyn R. & Creath, Katherine, "Liquid-crystal Point-diffraction interferometer," Optic Letters, Vol. 19, No. 12, pp. 916–918 Jun. 15, 1994. This article suggests that the entire semitransparent membrane 14 could be made from a liquid crystal material. By applying various potentials to the membrane, the phase of the test wave transmitted through the membrane is adjusted with respect to the phase of the reference wave transmitted through the pinhole in the membrane. Unfortunately, this design is also quite difficult to implement and can be used only for wavelengths at which the liquid crystal is transparent. A complex membrane structure, such as would be necessary in the Mercer et al. design would likely introduce unwanted distortions in the Airy pattern. An additional drawback is that the transparency of the liquid crystal is affected by the applied voltage, changing the visibility of the fringes.

Thus, there exists a need for a point diffraction interferometer which provides a reference wave of higher intensity and allows for simple phase shifting of the reference wave.

SUMMARY OF THE INVENTION

The present invention provides a point diffraction interferometer which overcomes the above-mentioned difficulties by providing separate reference and test beams directed onto the image plane. These two separate beams are formed so that they focus at different laterally separated positions on the image plane. Thus, the pinhole for the reference wave can be placed at a region of high intensity for the reference beam (e.g., the focal point). Because the pinhole is now laterally separated from the center of the Airy pattern (location of maximal intensity for the test beam), the interference pattern produced by combining the test wave and reference wave will include easy to interpret straight equidistant fringes. And because the reference pinhole is provided at a location of high intensity in the image plane, the relative intensities of the test and reference waves will be more closely matched than with prior point diffraction interferometers (where reference wave pinholes had to be located far removed from the center of intensity for the Airy pattern).

Also, because two separate beams are produced upstream from the image plane, the phases of the two beams can be independently controlled. Typically, a beam divider will divide a radiation source beam into the reference and test beams. The beam divider can be outfitted with one of several optional phase shifting elements to shift one of the test and reference beams with respect to the other.

In one aspect, a point diffraction interferometer of the present invention may be characterized as including (a) a test optic region at which a test optic is capable of being held; (b) a source of electromagnetic radiation located upstream of the test optic region and capable of producing a radiation beam directed toward a test optic region, such that an image is produced downstream from the test optic region at an image plane (e.g., a focal plane); (c) a beam divider for dividing the radiation beam into at least a reference beam and a test beam directed at different angles with respect to one another such that, when the test optic is held at the test optic region, the reference beam impinges at a first location on the image plane and the test beam impinges at a second location, laterally separated from the first location, on the image plane; (d) a pinhole provided at the first location on the image plane such that radiation from the reference beam which passes through the pinhole produces a diffraction limited reference wave; and (e) a detector (e.g., an array of charge coupled devices or photographic film) located downstream from the image plane for detecting an interference pattern produced by combining the reference wave and the test beam.

Point diffraction interferometers of this invention may be configured many different ways. The source of electromagnetic radiation may be, for example, a laser or a polychromatic source such as a mercury vapor lamp. If the source of radiation is not spatially coherent, the interferometer may include an input pinhole through with radiation passes before it illuminates the test optic. Radiation passing through the pinhole is spatially coherent and suitable for use in the interferometer.

The beam divider is preferably, though not necessarily, located between the source of electromagnetic radiation and the test optic region. Examples of suitable beam dividers include reflection type diffraction gratings, transmission type diffraction gratings, mirrors, two laterally separated pinholes, etc. In one case, the beam divider may include two mirrors, one reflecting a reference beam and the other reflecting a test beam. In another case, the beam divider may include a single mirror which reflects a portion of the radiation from the source to form either the test or reference beam. The unreflected portion of the source radiation passes directly to the test optic as either the reference or test beam, depending upon which beam the mirror created.

In another aspect, the present invention provides a method of generating an interference pattern with a point diffraction interferometer. This method generally may be characterized as including the following steps: (a) directing source radiation onto a test optic, the test optic having an image plane located downstream from the test optic; (b) dividing said source radiation into at least a reference beam and a test beam directed at different angles with respect to one another such that the reference beam impinges at a first location on the image plane and the test beam impinges at a second location, laterally separated from the first location, on the image plane; (c) passing the reference beam through a reference pinhole provided at the first location on the image plane to produce a diffraction limited reference wave; and (d) detecting and interference pattern produced by combining the reference wave and a test wave provided from the test beam.

The step of dividing may be performed with any of the beam dividers described above (e.g., a mirror, a double mirror, a reflection diffraction grating, a transmission diffraction grating, and a double pinhole structure). Further, the step of dividing may be conducted before the source radiation impinges on the test optic or after the source radiation impinges on the test optic (but before the source radiation reaches the image plane).

These and other features of the present invention will be presented in more detail in the following detailed description of the invention and the associated figures.

DESCRIPTION OF THE PREFERRED EMBODIMENTS

Generally, the present invention provides an improved point diffraction interferometer for optical metrology. While the invention is described in terms of a few specific embodiments, it is by no means so limited. Numerous specific details of these embodiments are set forth in order to provide a thorough understanding of the present invention. It will be apparent, however, that the present invention may be practiced without limitation to some of the specific details presented herein.

Figure 1:
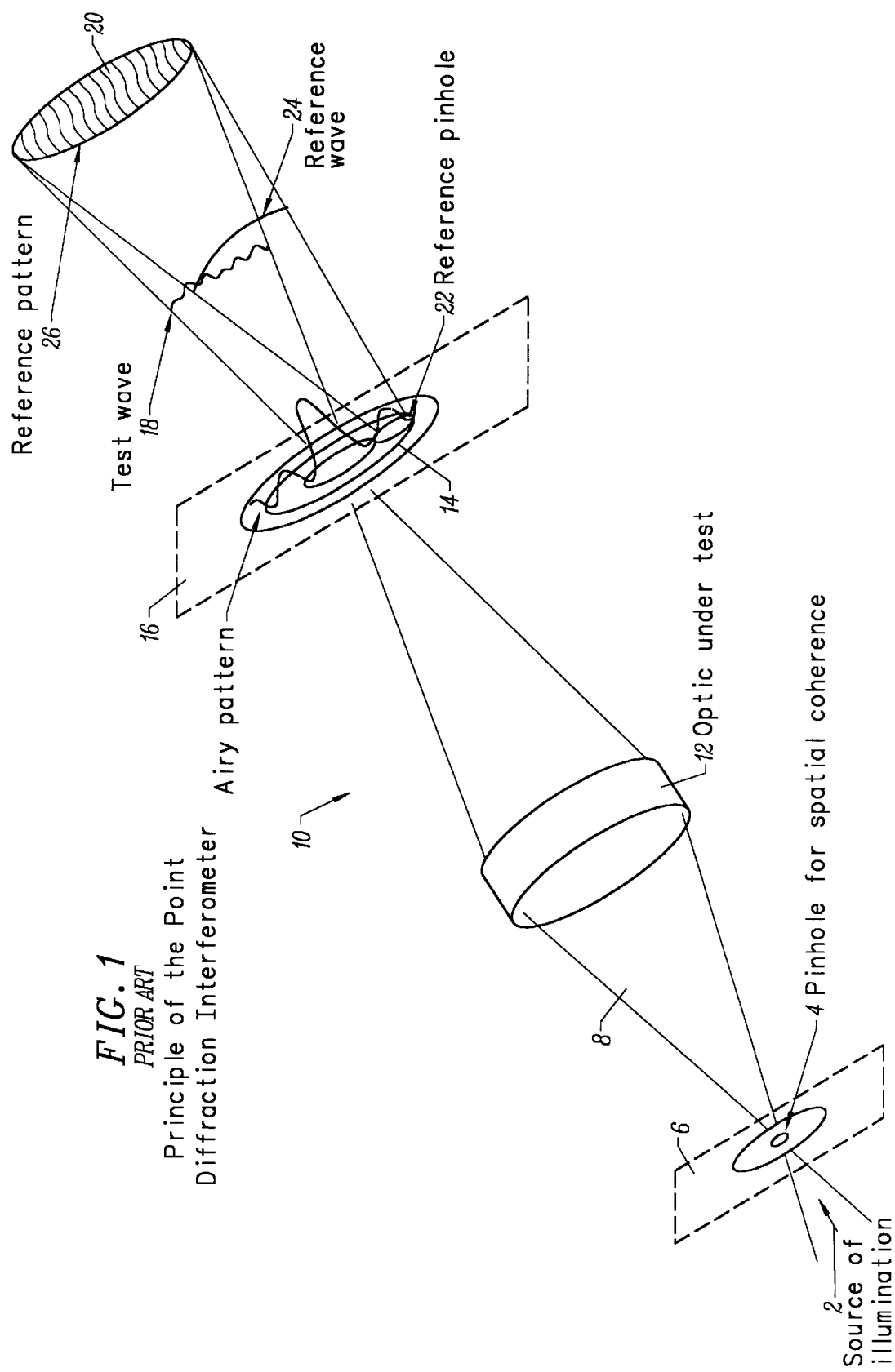
FIG. 1 is a schematic depiction of a conventional point diffraction interferometer.
Figure 2:
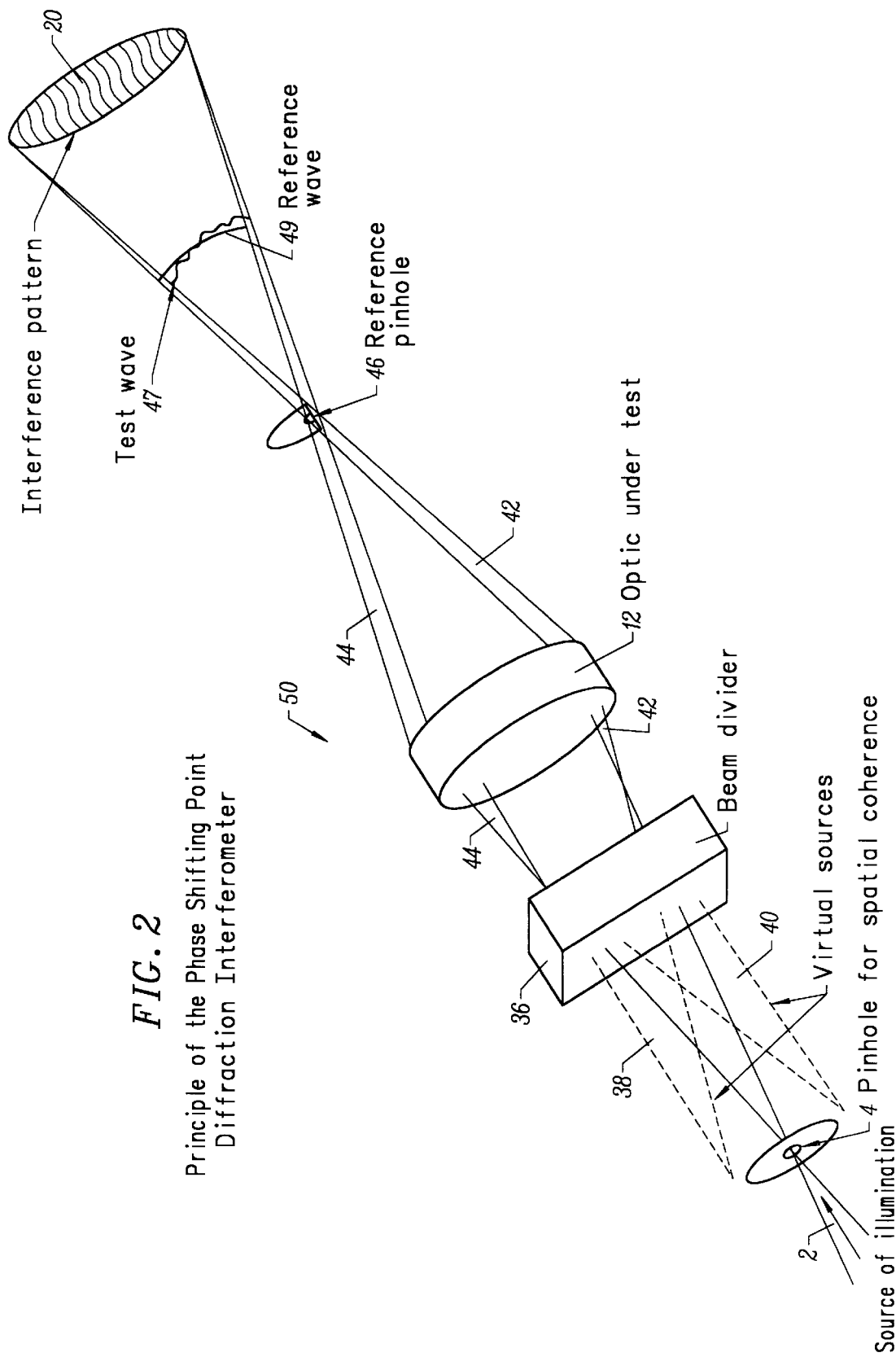
FIG. 2 is a schematic presentation of a point diffraction interferometer in accordance with the present invention and employing a generic beam divider.

FIG. 2 schematically illustrates the general layout of a point diffraction interferometer 50 as may be employed in various of the specific embodiments described below. The interferometer includes a source of electromagnetic radiation which directs a beam onto an input pinhole 4. If the pinhole is sufficiently small, electromagnetic radiation emitted through input pinhole 4 is spatially coherent. Spatially coherent radiation emitted by pinhole 4 impinges on a beam divider 36 which, in turn, produces two "perfect" beams with small angular separation, a test beam 42 and a reference beam 44. As shown, beam divider 36 provides test beam 42 with a virtual source 38 and provides reference beam 44 with a virtual source 40. Both test beam 42 and reference beam 44 pass through a test optic 12 which is to be evaluated, through its interferogram, for aberrations.

Test optic 12, which may be a mirror, a lens, etc., redirects test beam 42 and reference beam 44 downstream toward an image plane (often the plane containing the foci of the reference and test beams). In this manner, the optic under test 12 projects the two images of the two virtual sources which are distorted by the aberrations of the optic under test. One beam reaches a detector 20 directly; it is a test wave 47. The other beam is filtered at the image point and constitutes a "perfect" spherical reference wave 49 which, upon reaching detector 20, interferes with the aberrated test wave. Note that radiation from test beam 42 passing through the image plane is referred to herein as a "test wave". Note also that the alignment of reference beam 44 with respect to test optic 12 is not critical, as beam 44 is filtered to form a reference wave 49.

Because beam divider 36 divides radiation from source 2 into two separate beams having different virtual sources, radiation passing through test optic 12 will have two laterally separated foci. One of the radiation beams is reserved as the reference beam and the other is designated as the test beam.

At the image plane, a reference pinhole 44 transfers radiation from a high intensity region of reference beam 44 downstream to produce reference wave 49. Test beam 42 also passes through the image plane, but largely misses reference pinhole 46 (and its associated mask). This is because the region of maximal intensity of test beam 42 is laterally separated from the region of maximal intensity for reference beam 44 (i.e., the reference pinhole 46). Preferably, the mask around reference pinhole 46 is designed such that it blocks little or no portion of test beam 42. Since the reference pinhole is now centered at the focus of the reference beam, the intensity of the diffracted reference wave, relative to that of the conventional point diffraction interferometer, is increased by orders of magnitude.

As shown in FIG. 2, test wave 47 interferes with reference wave 49 on detector 20 to generate an interference pattern. Various detectors may be employed. These include, for example, a camera with photosensitive film, a CCD array, a Vidicon camera, etc.

As noted, a source pinhole 4 is employed to filter source radiation. This allows incoherent sources to be used with the present invention. However, if the source of radiation is spatially coherent—e.g. laser radiation—then source pinhole 4 may be unnecessary. In the absence of such suitable laser source, the necessary bandwidth and coherence of the illumination can be obtained using an incoherent source with an appropriate monochromator and source pinhole spatial filter 4. An example of such incoherent source is a mercury vapor lamp.

Various beam dividers may be employed in the present invention. These include, for example, diffraction gratings, mirrors, and pinholes. The embodiments presented below show each of these beam dividers in various configurations. Those skilled in the art will understand that these embodiments represent but a few of the many possible arrangements for practicing the present invention.

Because the reference and test beams have laterally separated foci, as explained, the reference beam may be converted to a high intensity reference wave without substantially interfering with the test wave. This should be contrasted with the prior art in which the position within the image plane where the reference wave could be generated with maximum intensity coincided with the position of maximum intensity for the test beam. As explained above, when the reference pinhole is placed in this location, the interference pattern on detector 20 becomes difficult to interpret, and also, substantial information may be lost from the test wave. By laterally separating the reference and test beam foci, a relatively high intensity reference wave may be generated to provide easy to interpret straight equidistant interference fringes.

The reference pinhole may be provided in an opaque (or semi-transparent) mask which is sized and located so as to not substantially interfere with the test beam. Typically the mask will be located at or near the focal plane (image plane) of the test optic. In an embodiment not shown, an opaque mask may include one tiny pinhole (the reference pinhole) and one large "window" centered at the respective foci of the two beams. The sub-resolution reference pinhole produces the reference wavefront by diffraction, while the window transmits the test wave without significant spatial filtering or attenuation. It should be noted that no semitransparent membrane is required, reducing the attenuation of signal, and eliminating problems of fragility, contamination and simplifying the construction of the mask.

The quality of the sub-resolution reference pinhole significantly influences the accuracy of the point diffraction interferometer. The sub-resolution reference pinhole must be smaller than the diffraction-limited focal spot of the optic under test. Thus, the pinhole diameter should approach the wavelength of the radiation. Further, the divergence of the reference wave emitted from the reference pinhole should be relatively large to fully illuminate the detector downstream. Sufficient divergence is accomplished automatically when the pinhole at the diffraction limit of the radiation is employed. As is known in the art, the angle in radians subtended by the radiation emitted from a pinhole is given by the expression $\alpha = 1.22 \, (\lambda/D)$, where $\lambda$ is the radiation wavelength and D is the aperture of the pinhole. The "perfection" of the reference wave is achieved by using a small pinhole, at the expense of signal amplitude.

While this invention allows the reference wave to have greater intensity than reference waves generated in prior art point diffraction interferometers, pinhole 46 will nevertheless reduce the intensity of reference wave 49 with respect to test wave 47. Therefore, some additional technique must be employed to equalize the intensities of these two waves. Various approaches to accomplish this are described in the embodiments presented below.

Figure 3:
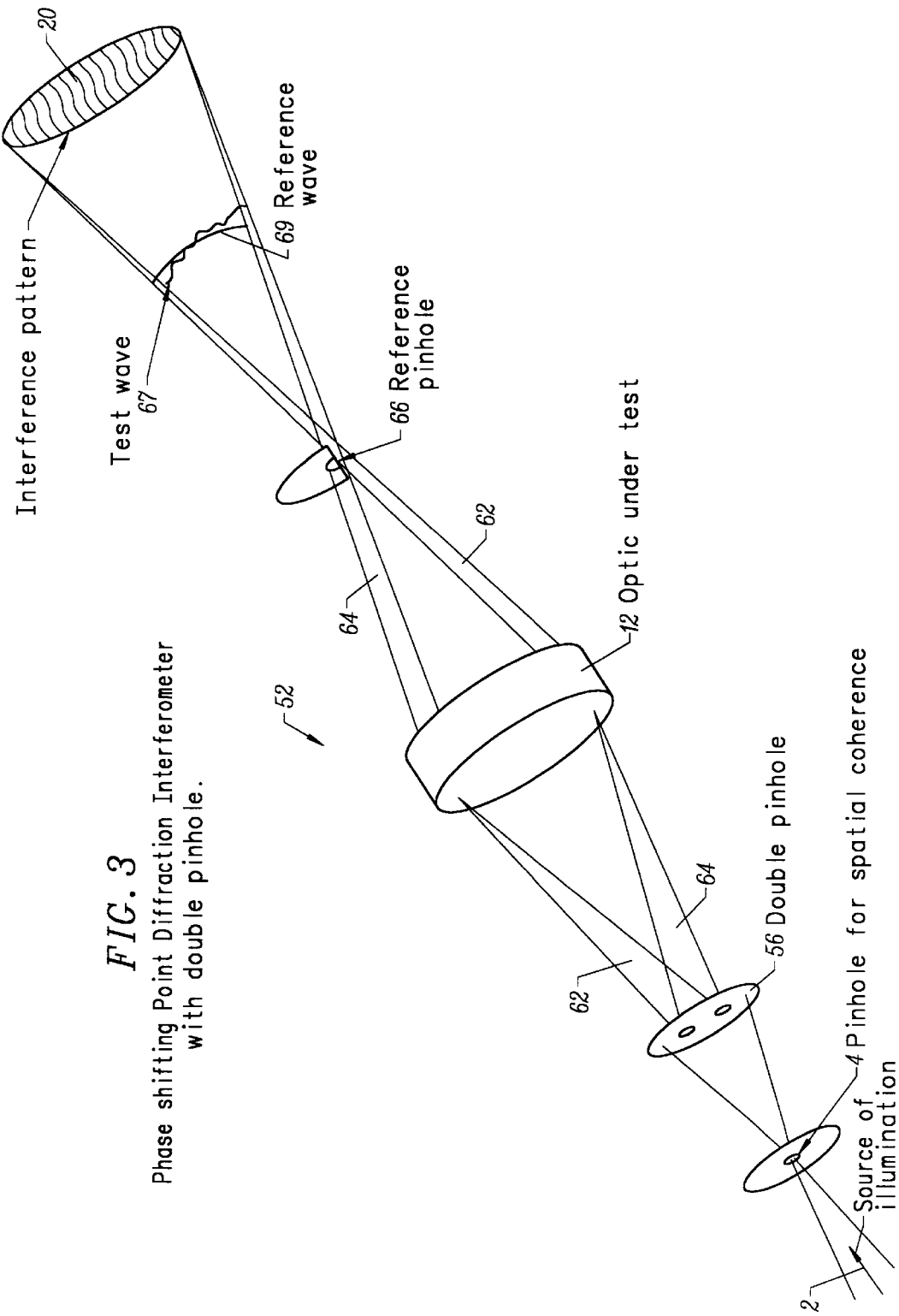
FIG. 3 is a schematic representation of a point diffraction interferometer employing a double pinhole structure to generate separated reference and test beams in accordance with one embodiment of the present invention.

FIG. 3 presents a point diffraction interferometer 52 including a double pinhole mask 56 located in the source plane (object plane) of the object under test. It is constructed with unequal diameter pinholes to compensate for the attenuation by the reference pinhole. As shown, a test beam 62 is emitted from a top pinhole in mask 56 and a reference beam 64 is emitted from a bottom pinhole in structure 56. Thus, the combination of two pinholes generates the separate reference and test beams. That is, double pinhole structure 56 serves as the beam divider 36 shown in FIG. 2. The relative sizes of the pinholes in structure 56 may be adjusted so that the intensities of the test and reference waves 67 and 69 are substantially equal. Because the reference wave 69 is emitted from a reference pinhole 66, the reference beam pinhole in structure 56 will generally be larger than the test beam pinhole. Thus, reference beam 64 will generally have a greater intensity than test beam 62. Both test and reference beams should fill the aperture of the optic under test and the sensitive area of the detector.

The phases of reference beam 64 and test beam 62 may be independently adjusted. This may be accomplished by, for example, providing one or more transparent films on one or the other of the pinholes in double pinhole structure 56. The pinhole on which such film is provided will emit a beam having its phase shifted. In one specific embodiment, phase control between the two waves may be obtained by inserting tapered layers of suitable materials on the path of either beam. Relative phase and equality of intensity can be adjusted by varying the thickness of the layers; the thickness may be adjusted by translating the tapered layer. At optical wavelengths, phase controlling layers can be fabricated with plastics, glass, mica, etc. In the ultraviolet range, thin metal or carbon layers are suitable.

Phase control allows calibration of detectors. The maximum and minimum intensities in an interference pattern can be determined by sequentially adjusting the phase of one of the reference and test waves with respect to the other. As the phase varies, a region of the detector may sequentially experience a dark fringe, an intermediate region between dark and light fringes, and a light fringe. By cycling through fringes in this manner, a given CCD detection element (or other detector pixel) may be compensated for difference of sensitivity among pixels.

Figure 4:
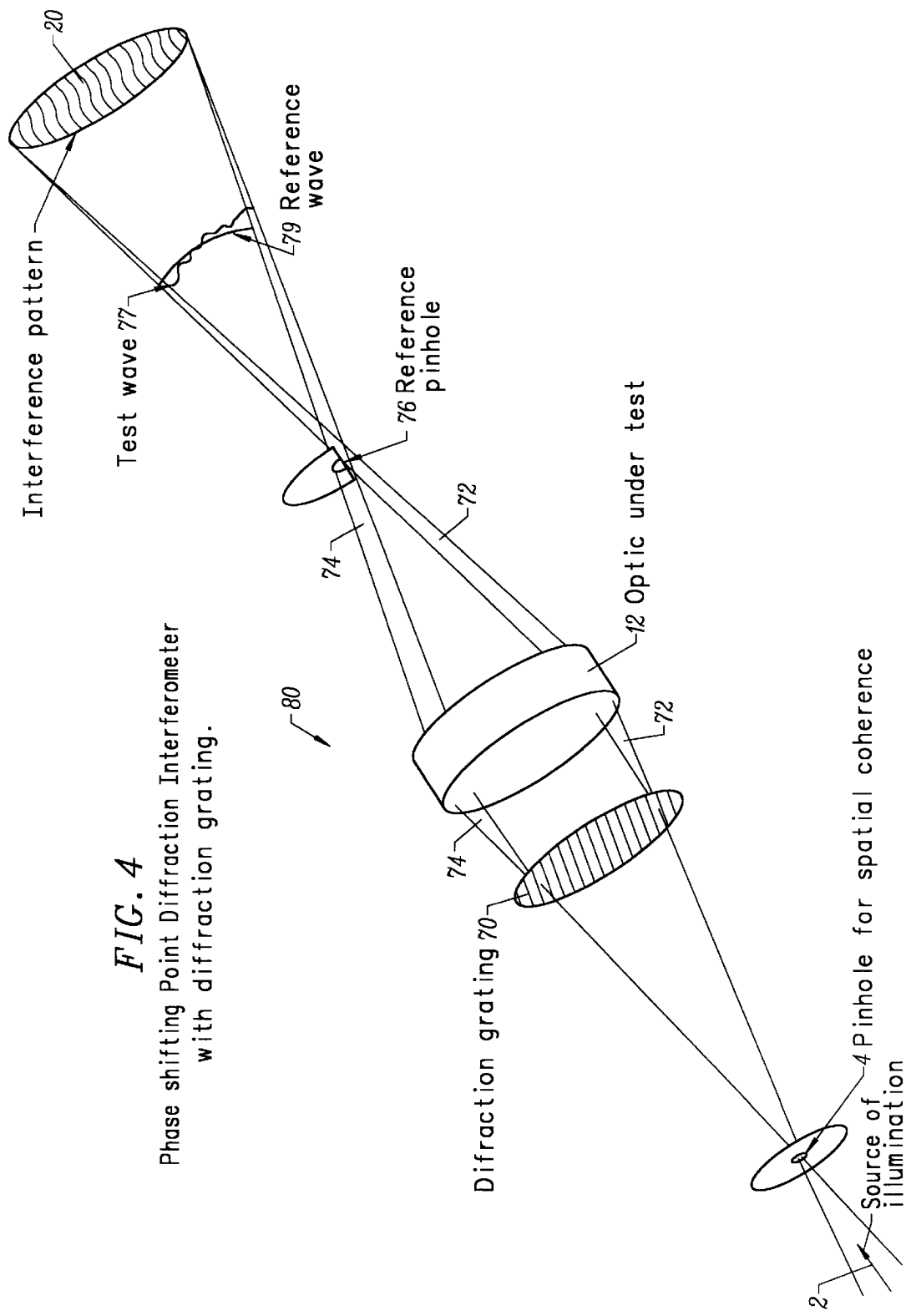
FIG. 4 is a schematic presentation of a point diffraction interferometer employing a diffraction grating to generate test and reference beams in accordance with another embodiment of the present invention.

FIG. 4 presents a point diffraction interferometer 80 employing a diffraction grating 70 as the beam divider. In the embodiment shown, diffraction grating 70 is provided between source pinhole 4 and test optic 12. Diffraction grating 70 will generate radiation beams of various orders. One of these orders is selected as a reference beam 74 and the other is selected as a test beam 72. Which diffraction order is adopted for test or reference beam depends on the relative strength between the beams at the detector. For example in FIG. 4 the reference pinhole 76 will attenuate the test wave while the reference wave propagates at full intensity. As a result, it may be convenient to use the strong zero order as a test wave and a weaker higher order for the reference wave in order to improve the visibility of fringes.

Both of the reference and test beams are directed onto test optic 12 where they are reshaped and directed to an image plane. Again, a reference pinhole 76 is provided at a region of maximal intensity for reference beam 74. Therefore, reference pinhole 76 emits a relatively high intensity reference wave 79. Test beam 72 passes by reference pinhole 76, largely unaffected, to produce a test wave 77. As in the previous embodiments, test wave 77 and reference wave 79 interfere with one another to generate an interference pattern on detector 20.

Grating 70 generates several orders with angular separation determined by the grating period. Two such orders are selected, one for the test beam 72 and the other for the reference beam 74. A two-aperture mask (not shown) may be used to select only two of the diffracted grating orders to use as the test and reference beams. In an embodiment not shown here, the diffraction grating may be located upstream from the object plane. The mask is provided in the object plane and includes a sub-resolution pinhole, centered on the test beam, which produces the spatially coherent illumination of the test optic, while filtering any aberrations introduced by the beamsplitter. A large window in the mask delivers the unattenuated light from the reference beam through the optic, to the reference pinhole in the image-plane mask.

In the embodiment shown in FIG. 4, diffracting grating 70 is a "transmission type" diffraction grating. Such gratings must be relatively transparent and should be oriented somewhat orthogonally to the direction of propagation of radiation from source 2. The design of such gratings is well known in the art. An example of a transmission type diffraction grating for extreme ultraviolet radiation is a gold grating mounted on thin membrane.

In an alternative embodiment, a reflection type diffraction grating may be used in place of transmission type diffraction grating 70. Like a transmission diffraction grating, a reflection diffraction grating generates multiple beams of varying intensity. However, unlike transmission diffraction grating 70, a reflection diffraction grating must be oriented to reflect light from source 2 into test optic 12. The design and use of transmission and reflection diffraction gratings are well known to those of skill in the art.

In the embodiment illustrated in FIG. 4, the relative intensities of test wave 77 and reference wave 79 are controlled by choosing beams of appropriate order from diffraction grating 70 as test beam 72 and reference beam 74. Generally, reference beam 74 will be a zero or low order beam from grating 70. Such low order beams generally have a rather high intensity compared to the higher order beams produced by a diffraction grating. Another method adjusts the relative intensity of the reference and test beams by adjusting the blaze of the grating bars on a reflection grating. Thus, for example, it may be desirable to increase the intensity of the first order beam with respect to the zero order beam by adjusting the blaze to provide specular reflection of the first order beam. This will be desirable when, for example, the first order is used to form the reference beam 74 and the zero order is used to form the test beam 72.

Phase shifting may be achieved by translating the grating in its plane and perpendicular to the grating direction. Specifically, translation of the grating by one grating period introduces a first-diffractive-order phase shift of a full cycle, while the phase of the zero-order transmitted beam remains constant.

Figure 5:
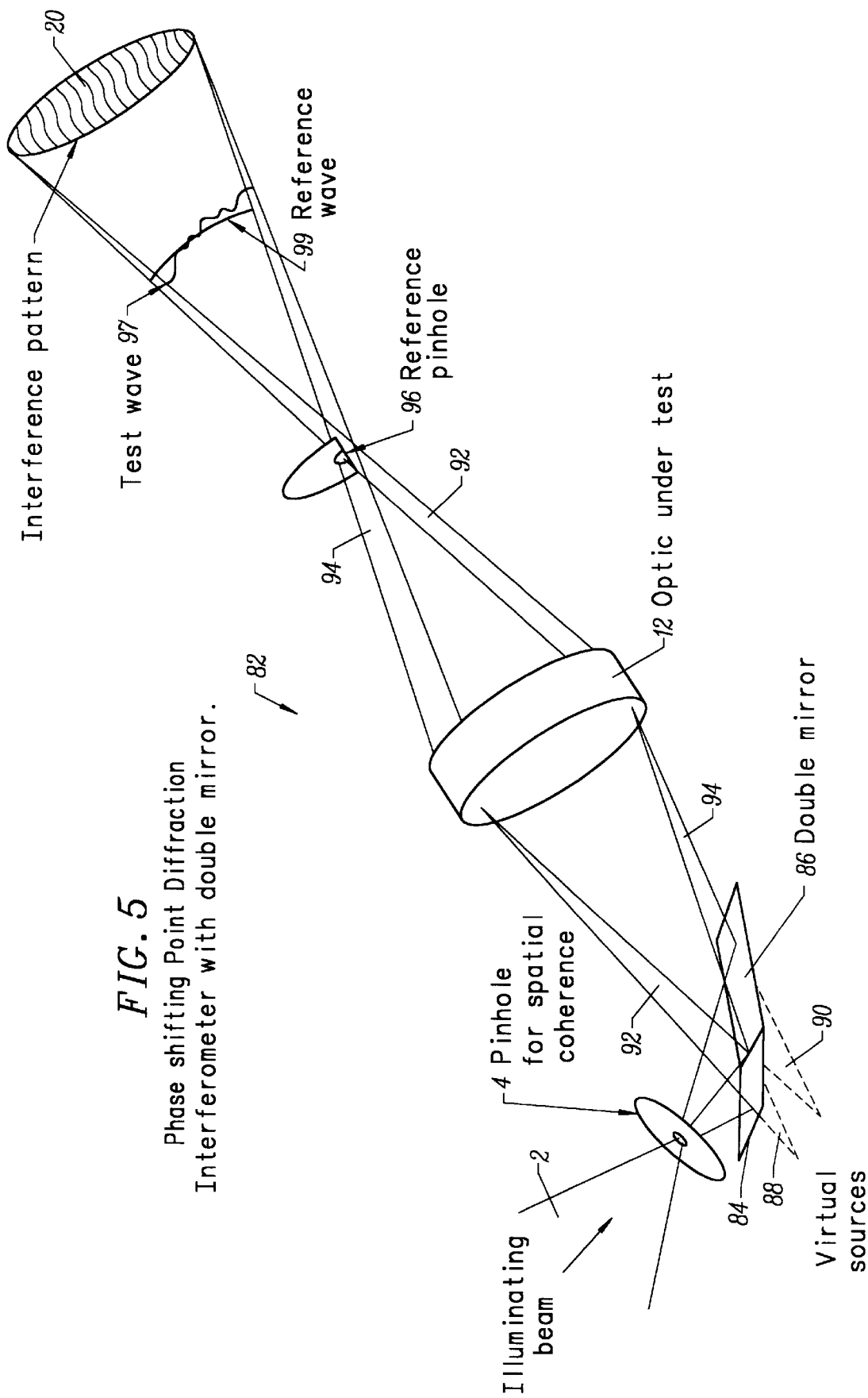
FIG. 5 is a schematic representation of a point diffraction interferometer employing a double mirror to generate test and reference beams in accordance with another embodiment of the present invention.

FIG. 5 presents a point diffraction interferometer 82 employing two mirrors, a test mirror 84 to generate a test beam 92 and a reference mirror 86 to generate a reference beam 94. This arrangement provides a virtual test beam source 88 and a virtual reference beam source 90 as shown. Mirrors 84 and 86 are oriented at slightly different angles so that the foci of test beam 92 and reference beam 94 (downstream from test optic 12 in the image plane) are laterally shifted with respect to one another. Various orientations of the two mirrors will produce the desired affect. Obviously, the angle between mirror 84 and mirror 86 will determine how far apart the foci of test beam 92 and reference beam 94 lie, and, consequently, the fringe density at detector 20. A reference pinhole 96 is, as before, provided at the focus of reference beam 94 in the image plane. This produces a reference wave 99 which interferes with a test wave 97 on detector 20.

The relative intensities of test beam 92 and reference beam 94 can be controlled by providing mirrors 84 and 86 with different reflectivities. Generally, the reflectivity of test beam mirror 84 will be lower than that of reference beam mirror 86.

The phases of test beam 92 and reference beam 94 may also be controlled by displacing one of the two mirrors with respect to the other along a direction perpendicular to its surface. As is known to those of skill in the art, various coatings or reflective media also may be employed to adjust the phase of reflected beams such as test beam 92 and reference beam 94.

Figure 6:
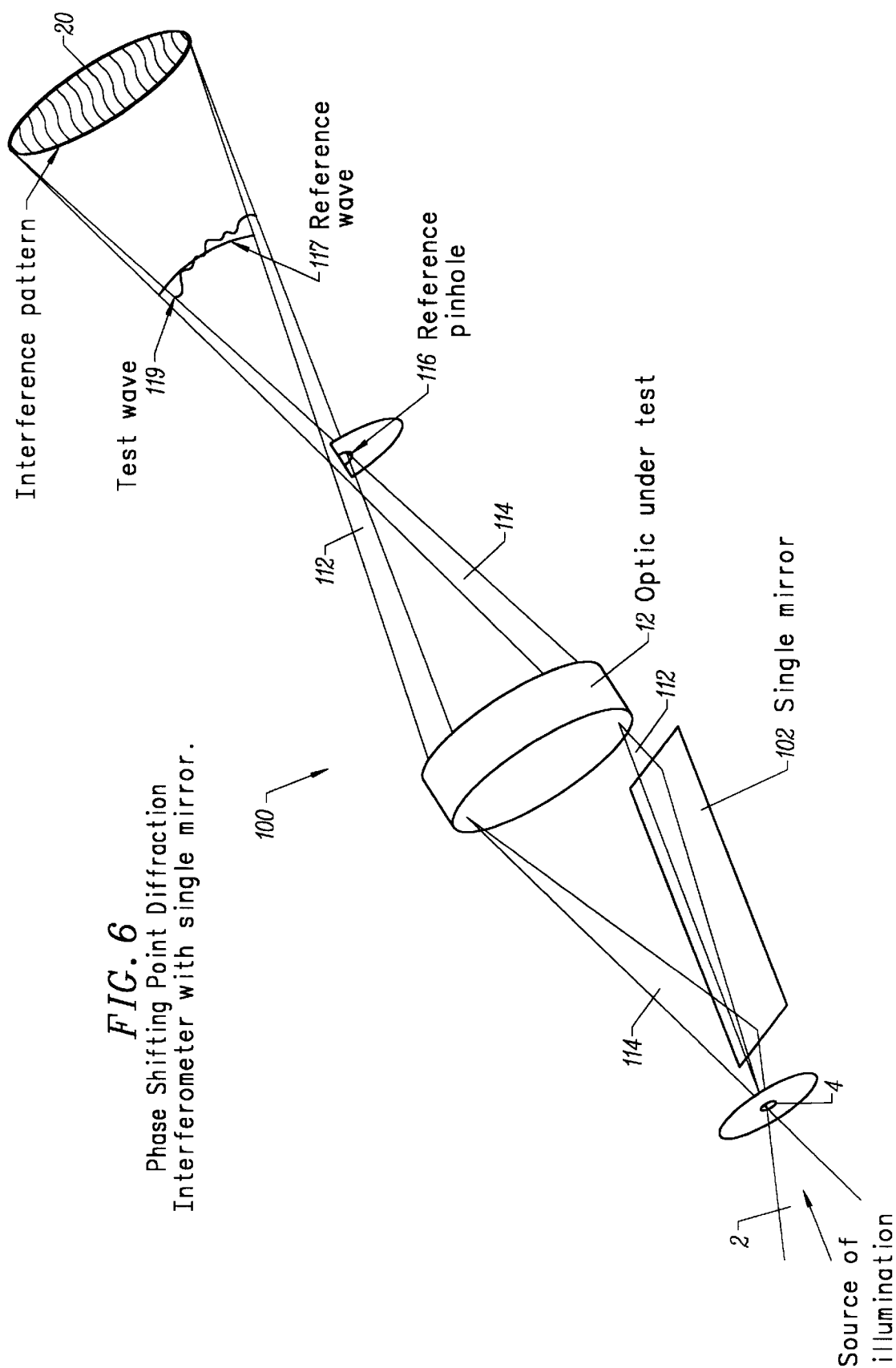
FIG. 6 is a schematic representation of a point diffraction interferometer employing a single mirror to generate separated test and reference beams in accordance with another embodiment of the present invention.

FIG. 6 shows a point diffraction interferometer 100 employing a single mirror 102 which reflects a portion of the source radiation to produce a test beam 112. The unreflected portion of source radiation 2 impinges on test optic 12 directly. This portion constitutes a reference beam 114. This approach of using a single mirror to reflect a portion of source radiation, while allowing the remainder of the source radiation to pass unreflected is commonly employed in an interferometer known as a Lloyds interferometer. Preferably, mirror 102 has a reflectivity chosen to ensure that a test wave 119 and a reference wave 117 have roughly equal intensities. The phase between beams is adjusted by translating the mirror orthogonal to its surface.

As shown, test beam 112 passes through the image plane largely unscathed. And reference beam 114 passes through a reference pinhole 116 to generate perfect spherical reference wave 117.

Figure 7:
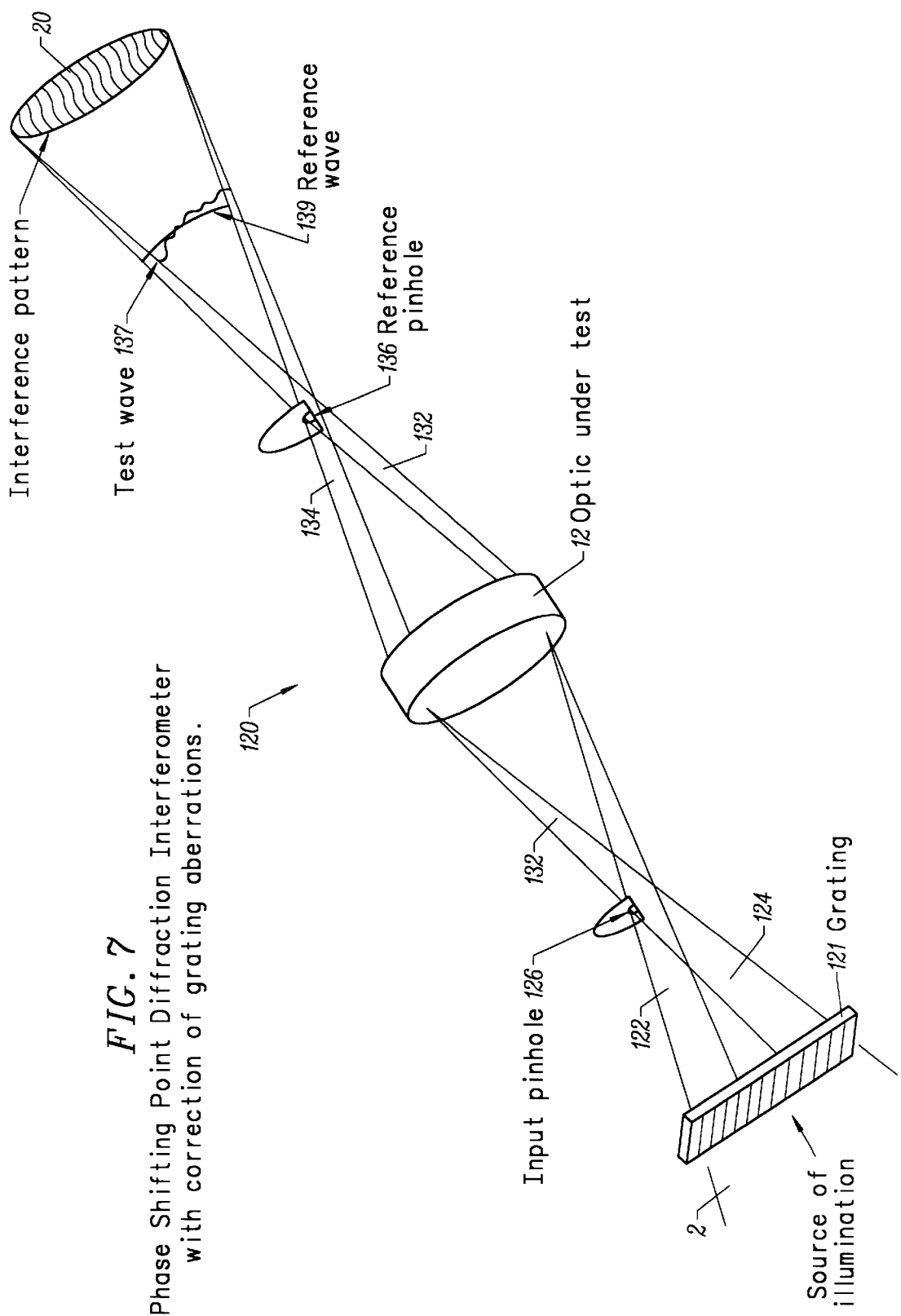
FIG. 7 is a schematic representation of a point diffraction interferometer employing a diffraction grating located upstream from a spatial coherence input pinhole in accordance with another embodiment of the present invention.

Referring now to FIG. 7, a point diffraction interferometer 120 is shown with a transmission type diffraction grating 121 located upstream of a input pinhole 126. Note that in all the embodiments shown to this point, the beam divider was placed downstream from input pinhole 4.

As shown in FIG. 7, source radiation 2 impinges on diffracting grating 121 which emits a test source 122 and a reference source 124. These two sources are laterally separated in the object plane which includes an input pinhole 126. Note that only radiation from test source 122 passes through input pinhole 126. Radiation from reference source 124 passes through the object plane largely unattenuated by input pinhole 126. This produces a reference beam 134 which may not be spatially coherent. This is not a problem, however, as a reference pinhole 136 which emits a perfect spherical reference wave 139. A spatially coherent test beam 132 passes through test optic 12 which focuses it at a position on the image plane laterally separated from pinhole 136. From there, a test wave 137 impinges on detector 20 and interferes with reference wave 139 to generate an interference pattern.

An advantage of this embodiment lies in the fact that a quite high intensity reference wave 139 may be generated. This is because reference beam 134 impinging on reference pinhole 136 has not been previously attenuated by an input pinhole. In this embodiment, the input pinhole 126 is reserved for emitting test beam 132. As the reference beam 134 need not be spatially coherent, this provides very little down side.

Figure 8:
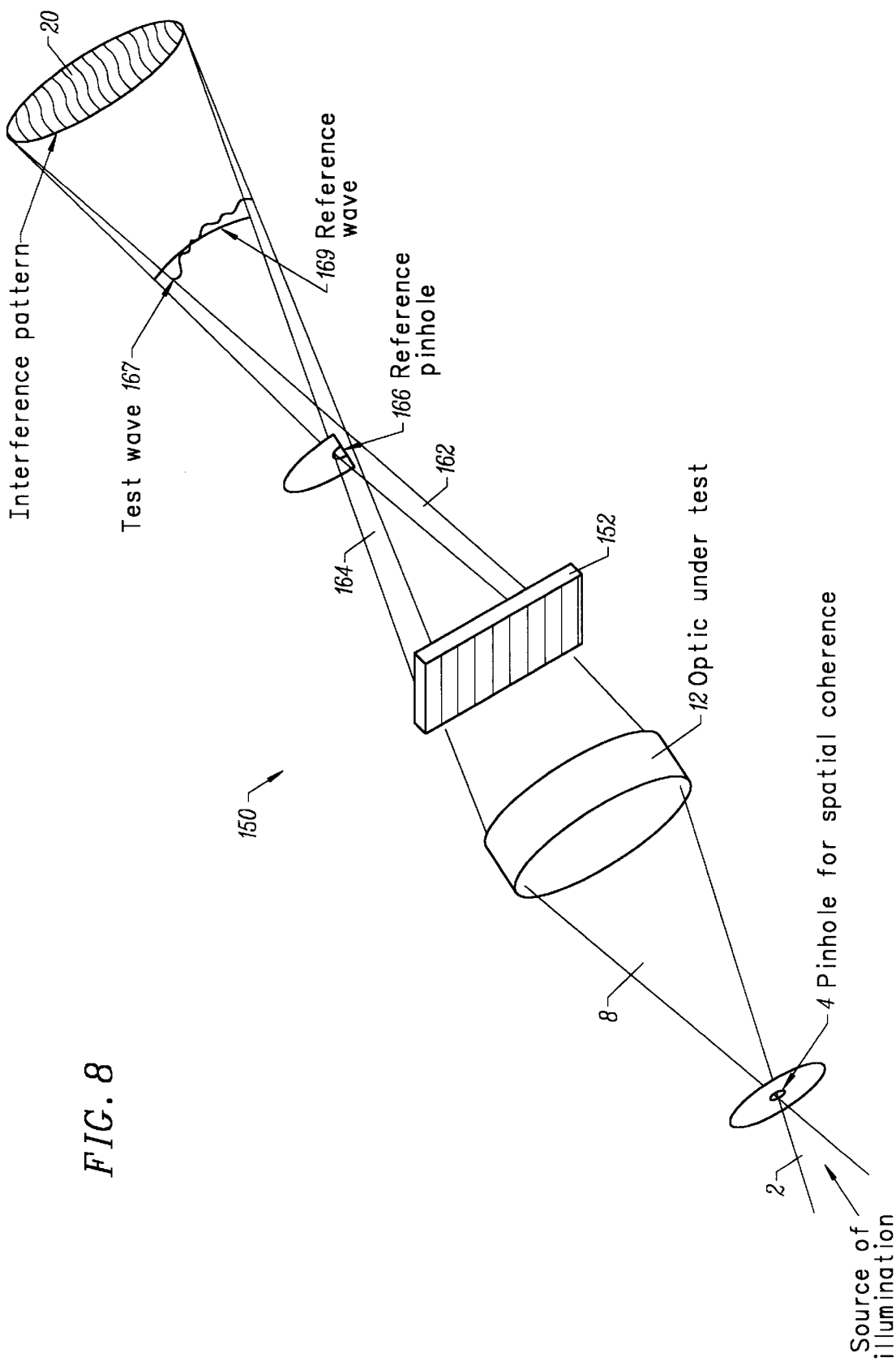
FIG. 8 is a schematic representation of a point diffraction interferometer employing a beam divider located downstream from a test optic in accordance with yet another embodiment of the present invention.

FIG. 8 presents yet another point diffraction interferometer design 150. Unlike the above described embodiments, point diffraction interferometer 150 employs a beam divider located downstream from a test optic. In this embodiment, source radiation 2 passes through a spatial coherence pinhole 4 as described above to produce an input beam 8 which impinges on test optic 12. Reshaped radiation from test optic 12 impinges on a diffraction grating 152 which generates a reference beam 164 and a laterally separated test beam 162. Reference beam 164 passes through a pinhole 166 which generates a perfect spherical reference wave 169 for illuminating detector 20. At the same time, test beam 162 passes through the image plane largely unaffected by pinhole 166 to produce a test wave 167 which also illuminates detector 20 and interferes with reference wave 169 to produce an interference pattern. This design makes substantial room available for the grating between object and optic or between optic and image.

In point diffraction interferometers 120 and 150 shown in FIGS. 7 and 8, the relative intensities and phases of the test and reference beams may be adjusted as described above. For example, in the embodiment shown in FIG. 7 (interferometer 120), a phase shifting film may be provided on one or both of input pinhole 126 and reference pinhole 136. Similarly, in the embodiment shown in FIG. 8 (interferometer 150), reference pinhole 160 may be provided with a phase shifting film.

It should also be understood that in each of the above embodiments employing a diffracting grating, that grating may be either a transmission type diffraction grating or a reflection type diffraction grating. Still further, in the embodiments shown in FIGS. 7 and 8, the beam divider need not be a diffraction grating. In some embodiments it may be a double pinhole structure such shown in FIG. 3. Alternatively, it may be one or more mirrors a shown in FIGS. 5 and 6.

High numerical aperture or aspheric element testing may require adaptations to prevent the interference fringe density from exceeding the spatial resolution of certain detectors. For example, accurate measurement of high numerical aperture systems may require a relay optic, introduced between the image plane and the detector, to project the image of the pupil of the system onto the detector. A well-corrected relay optic would be needed to avoid introducing distortion into the recorded interference pattern and to minimize the difference in the optical paths of the test and reference waves, which propagate in slightly different directions through the relay optic.

In the image plane, the optimal separation distance of the reference wave pinhole and the test wave center will vary from system to system. The lateral separation of the test and reference spots in the image plane must be sufficient to prevent significant overlap. Without sufficient separation, a portion of the wave illuminating the reference pinhole can be transmitted through the test wave window, producing unwanted interference in the recorded fringes. Also, important portions of the test wave can pass through the reference wave pinhole. Thus, when the test object focus and the reference pinhole approach one another too closely, significant information content from the test wave may be lost. Still further, the fringes' curvature may strongly increase making them more difficult to read.

As the lateral distance between the two points increases, the fringe density also increases (i.e., the number of fringes in a given region increase so that the fringes become more closely spaced). Thus, if the points are separated by too great a distance, the fringes become difficult to analyze.

A knife edge may be employed in one simple technique for approximating an optimal separation distance. In this technique, a knife blade is scanned across the focus of the optic under test. The intensity of radiation passing by the knife blade is monitored. A transition region is observed between maximum intensity (when the beam passes by free of the blade) and minimum intensity (when the beam is completely blocked by the knife). The width of this transition region roughly gauges the quality of the optic, with smaller transition regions corresponding to sharper foci and better quality optics. For purposes of the point diffraction interferometers, the width of this transition region often corresponds to an appropriate separation distance for the reference wave pinhole and the center of the test optic image. Thus, if the transition region between maximum intensity and minimum intensity occurs over about 10 $\mu$m, then the point diffraction interferometer should be designed such that the reference beam pinhole and the test image focal point are also separated by about 10 $\mu$m. EXAMPLE To study the capabilities of the point diffraction interferometers of this invention, a prototype system using visible light was constructed. Several interferometer configurations that incorporate a grating beamsplitter have been used to measure aberrations in test optics, including microscope objectives and camera lenses.

In one experiment, a low-power Helium-Neon laser with 632.8 nanometer wavelength was used as a light source. The laser light was collected with a lens and focused onto an object pinhole mask that produced spatially coherent illumination of the optic under test. Commercially available laser-drilled pinholes were used for the single and double-pinhole masks. The entrance pinhole size was chosen to coherently overfill the numerical aperture of the test optic, and a sub-resolution reference pinhole size was selected to provide a strongly spatially filtered reference wavefront. The grating was a coarse Ronchi ruling.

One experiment performed with the described interferometer involved the measurement of a microscope objective lens. The lens was arranged to have a demagnification of 10 and an image-side numerical aperture of 0.1. A 100 $\mu$m pitch beamsplitter grating was placed upstream of the optic object plane, having the configuration shown schematically in FIG. 7. The entrance pinhole mask in the object plane contained a 20 $\mu$m diameter pinhole to produce spatially coherent test beam to illuminate the optic and a 400 $\mu$m wide window to transmit the reference beam. The mask in the image plane contained a 2 $\mu$m diameter reference pinhole, and a 40 $\mu$m wide window to transmit the test wave. The separation of the test and reference wave foci in the image plane was approximately 40 $\mu$m. The fringe patterns were detected with a 512 by 512 pixel, 6.2 by 4.6 mm$^2$, 8-bit CCD camera, placed approximately 2 cm from the image plane. This point diffraction interferometer experiment was performed on an optical bench for stability.

To assess the repeatability and self-consistency of the measurements, the microscope objective was measured at two different axial rotation orientations. In both positions, a series of images with quarter-cycle phase shifts was recorded. A nine-step phase reconstruction algorithm was applied to the raw data, and the aberration phase map was fit to the first 37 Zernike polynomials, over a circular region 480 pixels wide. The optic was rotated axially by 181° between the two measurements. A comparison of the measured aberration polynomial coefficients was made and the largest uncertainty in the coefficients, based on the fit variance, was found to be 0.00016 waves. The coefficients of the second measurements were numerically rotated by 181° for direct comparison with the first measurement. The aberrations followed the rotation of the test optic, and largest difference between the two sets of coefficients was 0.0050 waves. The r.m.s. difference between the two measured phase maps was 0.0037 waves, indicating self-consistent agreement to approximately $\lambda$250. For this optic, the wavefront variance was on the order of 0.025 waves r.m.s. at 632.8 nanometers, revealing the interferometer's ability to characterize nearly diffraction-limited optics.

Although the foregoing invention has been described in some detail for purposes of clarity of understanding, it will be apparent that certain changes and modifications may be practiced within the scope of the appended claims. For instance, although the specification has described point diffraction interferometers having a common path, other interferometers having different paths for the reference and test beam may also be used. In addition, the reader will understand that the point diffraction interferometers described herein can be used to test radiation shaping elements other than conventional optics such as lens and mirrors.

What is claimed is:

1. A point diffraction interferometer comprising:

a test optic region at which a test optic is capable of being held;

a source of electromagnetic radiation located upstream of the test optic region and capable of producing a radiation beam directed toward a test optic region, such that an image is produced downstream from the test optic region at an image plane;

a beam divider for dividing said radiation beam into at least a reference beam and a test beam directed at different angles with respect to one another such that, when the test optic is held at the test optic region, the reference beam impinges at a first location on the image plane and the test beam impinges at a second location, laterally separated from the first location, on the image plane;

a phase shifting mechanism for adjusting the phase of at least one of the reference beam and the test beam;

a pinhole provided at the first location on the image plane such that radiation from the reference beam which passes through the pinhole produces a reference wave; and a detector located downstream from the image plane for detecting an interference pattern produced by combining the reference wave and a test wave provided from said test beam.

2. The point diffraction interferometer of claim 1, wherein the source of electromagnetic radiation is a laser.

3. The point diffraction interferometer of claim 1, wherein the source of electromagnetic radiation is a polychromatic source.

4. The point diffraction interferometer of claim 1, further comprising an input pinhole located between the test optic region and the source of electromagnetic radiation whereby radiation passing through said input pinhole is spatially coherent.

5. The point diffraction interferometer of claim 1, wherein the beam divider is located between the source of electromagnetic radiation and the test optic region.

6. The point diffraction interferometer of claim 1, wherein the beam divider is a diffraction grating.

7. The point diffraction interferometer of claim 6, wherein the diffraction grating is a reflection type diffraction grating.

8. The point diffraction interferometer of claim 6, wherein the diffraction grating is a transmission type diffraction grating.

9. The point diffraction interferometer of claim 6, wherein the diffraction grating is located between the source of electromagnetic radiation and the test optic region.

10. The point diffraction interferometer of claim 6, wherein the diffraction grating is located between the test optic region and the image plane.

11. The point diffraction interferometer of claim 1, wherein the beam divider includes two laterally separated pinholes, such that radiation from the radiation beam passing through one of the pinholes constitutes the reference beam and radiation from the radiation beam passing through the other of the pinholes constitutes the test beam.

12. The point diffraction interferometer of claim 1, wherein the beam divider includes a mirror which reflects at least a portion of the radiation beam to form at least one of the reference beam and the test beam.

13. The point diffraction interferometer of claim 12, wherein the beam divider includes a first mirror which reflects a portion of the radiation beam to form the reference beam and a second mirror which reflects a second portion of said radiation beam to form the test beam.

14. The point diffraction interferometer of claim 12, wherein said mirror reflects a first portion of the radiation beam to form at least one of the reference beam and the test beam, and second portion of the radiation passes directly to the test optic region as the test beam or the reference beam.

15. The point diffraction interferometer of claim 1, wherein the image plane includes the focal point of the reference beam passing through said test optic.

16. The point diffraction interferometer of claim 1, wherein the detector is an array of charge coupled devices.

17. A method of generating an interference pattern with a point diffraction interferometer, the method comprising:

directing source radiation toward a test optic provided in a test optic region of the point diffraction interferometer, the test optic having an image plane located downstream from the test optic;

dividing said source radiation into at least a reference beam and a test beam directed at different angles with respect to one another such that the reference beam impinges at a first location on the image plane and the test beam impinges at a second location, laterally separated from the first location, on the image plane;

phase-shifting at least one of the reference beam and the test beam;

passing the reference beam through a reference pinhole provided at the first location on the image plane to produce a reference wave; and detecting and interference pattern produced by combining the reference wave and a test wave provided from said test beam.

18. The method of claim 17, wherein said dividing is conducted with an optical device selected from the group consisting of a mirror, a double mirror, a reflection diffraction grating, a transmission diffraction grating, and a double pinhole structure.

19. The method of claim 17, wherein said dividing is conducted before said source radiation impinges on said test optic.

20. The method of claim 17, wherein said dividing is conducted after said source radiation impinges on said test optic but before said source radiation reaches the image plane.

21. The method of claim 17, wherein said detecting is performed with a detector selected from the group consisting of a photographic film, and an array of charge coupled device.

* * * * *